(12) United States Patent
Ichioka

(10) Patent No.: US 9,009,549 B2
(45) Date of Patent: Apr. 14, 2015

(54) MEMORY DIAGNOSTIC APPARATUS AND MEMORY DIAGNOSTIC METHOD AND PROGRAM

(75) Inventor: Ryoya Ichioka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 183 days.

(21) Appl. No.: 13/885,779

(22) PCT Filed: Feb. 18, 2011

(86) PCT No.: PCT/JP2011/053465
§ 371 (c)(1),
(2), (4) Date: May 16, 2013

(87) PCT Pub. No.: WO2012/111135
PCT Pub. Date: Aug. 23, 2012

(65) Prior Publication Data
US 2013/0238947 A1    Sep. 12, 2013

(51) Int. Cl.
*G11C 29/00*  (2006.01)
*G06F 11/26*  (2006.01)
*G11C 29/04*  (2006.01)
*G11C 29/10*  (2006.01)
*G11C 29/56*  (2006.01)

(52) U.S. Cl.
CPC ............... *G06F 11/26* (2013.01); *G11C 29/04* (2013.01); *G11C 2229/00* (2013.01); *G11C 29/00* (2013.01); *G11C 29/10* (2013.01); *G11C 29/56* (2013.01)

(58) Field of Classification Search
CPC ........ G11C 29/00; G11C 29/04; G11C 29/10; G11C 2229/00; G11C 29/56; G06F 11/26
See application file for complete search history.

(56) References Cited

U.S. PATENT DOCUMENTS

| | | |
|---|---|---|
| 5,937,367 A | 8/1999 | Eckardt |
| 6,430,709 B1 | 8/2002 | Watanabe |
| 2006/0253749 A1* | 11/2006 | Alderegula et al. ............ 714/718 |
| 2008/0010567 A1* | 1/2008 | Hughes .......................... 714/718 |
| 2008/0198650 A1* | 8/2008 | Shalvi et al. .............. 365/185.02 |

(Continued)

FOREIGN PATENT DOCUMENTS

| | | |
|---|---|---|
| JP | 6 282500 | 10/1994 |
| JP | 10 154105 | 6/1998 |

(Continued)

OTHER PUBLICATIONS

Notice of Rejection issued Jul. 30, 2013 in Japanese Patent Application No. 2012-557749 (with English translation).

(Continued)

*Primary Examiner* — John P Trimmings
(74) *Attorney, Agent, or Firm* — Oblon, McClelland, Maier & Neustadt, L.L.P.

(57) ABSTRACT

A RAM to be diagnosed is divided into n (n being an integer of 3 or greater) pieces of base regions. In an idle time of periodic processing performed in a system in which the RAM is incorporated, two base regions are selected from the divided base regions, and the selected two base regions are diagnosed using a diagnostic method capable of detecting a coupling fault. Thereafter, in an idle time of the periodic processing, operations to select an unselected pair of base regions and diagnose the selected pair are repeated, so as to diagnose all combinations of pairs.

5 Claims, 3 Drawing Sheets

(56) References Cited

U.S. PATENT DOCUMENTS

| | | | |
|---|---|---|---|
| 2009/0089631 A1* | 4/2009 | Kanamaru et al. | 714/719 |
| 2009/0144584 A1* | 6/2009 | Rowles et al. | 714/25 |

FOREIGN PATENT DOCUMENTS

| | | |
|---|---|---|
| JP | 11 39231 | 2/1999 |
| JP | 2000 66963 | 3/2000 |
| JP | 2000 285033 | 10/2000 |
| JP | 2007 140920 | 6/2007 |
| JP | 2007 257271 | 10/2007 |
| JP | 2010 97432 | 4/2010 |
| KR | 10-2008-0063407 A | 7/2008 |
| WO | WO 2007/055068 A1 | 5/2007 |

OTHER PUBLICATIONS

Office Action issued Aug. 29, 2014 in Korean Patent Application No. 10-2013-7017578 with partial English language translation.

Nair R. et al., "Efficient Algorithms for Testing Semiconductor Random-Access, Memories," IEEE Transactions on Computers, vol. C-27, No. 6, pp. 572-576, (Jun. 1978).

International Search Report issued Apr. 26, 2011 in PCT/JP11/053465 filed Feb. 18, 2011.

* cited by examiner

MEMORY DIAGNOSTIC APPARATUS AND MEMORY DIAGNOSTIC METHOD AND PROGRAM

TECHNICAL FIELD

The present invention relates to a technology for diagnosing the presence or absence of a memory fault.

BACKGROUND ART

In a conventional diagnostic method, an entire memory (hereinafter also described as RAM: Random Access Memory) is diagnosed at a time, and a memory fault is detected by performing read and write operations on the entire memory and comparing each value with an expected value (for example, Non-Patent Literature 1).

CITATION LIST

Non-Patent Literature

Non-Patent Literature 1: R. Nair, S. M. Thatte and J. C. Abraham.: Efficient algorithms for testing semiconductor random-access memories. IEEE Transactions on Computers, C-27, pp. 572-576 (1978).

DISCLOSURE OF INVENTION

Technical Problem

The method discussed in Non-Patent Literature 1 is a RAM diagnostic method using software.

In the method of Non-Patent Literature 1, a RAM fault is detected by performing read and write operations on the RAM and comparing each value with an expected value.

Thus, the method has an attribute that a stack area used by applications is occupied, thereby affecting operations of other applications.

The method also has an attribute that read and write operations on the entire RAM involves a large amount of processing.

Because of these attributes, when the method of Non-Patent Literature 1 is to be applied to an embedded system, the method cannot be adapted for periodic processing typical of the embedded system, since the method requires a long period of processing time and does not implement time-division processing.

Therefore, there is a problem in that time dedicated to the diagnosis of the RAM is required separately from application execution time, thereby significantly affecting application availability.

It is a primary object of the present invention to solve the above-described problem. The present invention primarily aims to perform a memory diagnosis capable of detecting a coupling fault without affecting application availability.

Solution to Problem

A memory diagnostic apparatus according to the present invention includes a region segmentation unit that divides a region of a memory to be diagnosed into n (n being an integer of 3 or greater) pieces of partial regions; and a diagnosis execution unit that repeats operations to select two partial regions from the n pieces of partial regions and diagnose the two partial regions selected using a diagnostic method capable of detecting a coupling fault, in an idle time of periodic processing performed in a system in which the memory is incorporated, so as to diagnose all combinations of pairs of partial regions.

Advantageous Effects of Invention

According to the present invention, a diagnosis is carried out in an idle time of periodic processing performed in a system in which a memory to be diagnosed is incorporated, so that application availability is not affected.

A diagnosis using a diagnostic method capable of detecting a coupling fault is performed on all combinations of pairs of partial regions, so that a coupling fault can be detected effectively.

DESCRIPTION OF PREFERRED EMBODIMENTS

First Embodiment

Figure 1:
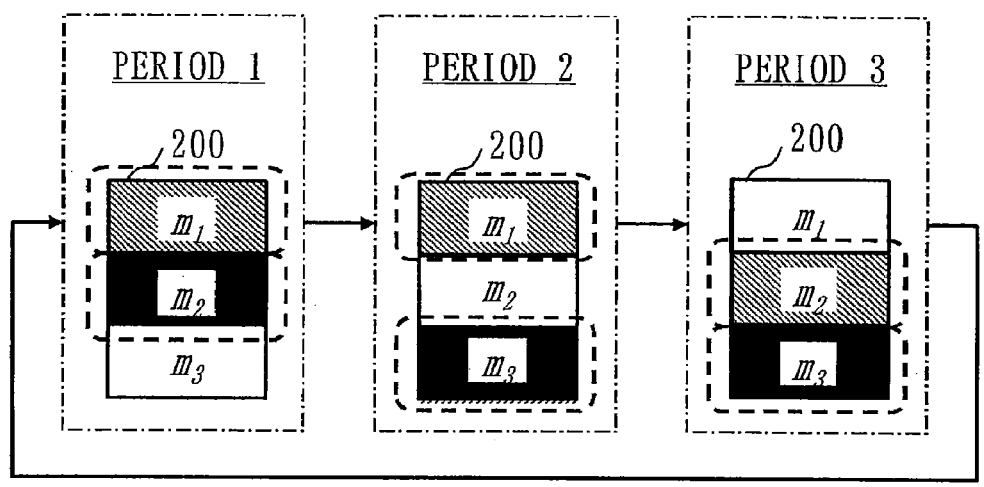
FIG. 1 is a diagram illustrating an overview of a memory diagnostic method according to a first embodiment.

In this embodiment, to solve the problem of conventional art, a memory diagnostic method capable of time-division processing will be described.

More specifically, in the memory diagnostic method according to this embodiment, a RAM diagnostic process which involves a large amount of diagnostic processing is time-divisioned, and time-division processing of a RAM diagnosis is executed in an idle time of periodic processing performed in a system (for example, an embedded system) in which a RAM to be diagnosed is incorporated.

This arrangement eliminates the need for time dedicated to the diagnostic process, and it is thereby possible to eliminate ramifications on application availability in the system in which the RAM is incorporated.

When time-division processing is performed, it is conceivable that the RAM region to be diagnosed is simply divided. However, simply dividing the RAM region allows read and write operations only on a memory cell within a divided region, so that a coupling fault may not be detected.

A coupling fault is a failure model of the RAM, and refers to a failure in which a read or write operation on a given memory cell causes the data value of another memory cell to change.

To detect a coupling fault, it is necessary to observe a given memory cell and investigate whether or not there is a change in the content of the memory cell being observed after read and write operations are performed on all the other memory cells.

Simply dividing the RAM region allows read and write operations only within a divided range. Thus, a coupling fault occurring over two or more divided ranges cannot be detected.

In this embodiment, the memory diagnostic method will be described by which a diagnosis is carried out in an idle time of periodic processing performed in a system in which a RAM to be diagnosed is incorporated. The memory diagnostic method eliminates ramifications on application availability in the system, and is capable of detecting a coupling fault.

First, the principles of the memory diagnostic method according to this embodiment will be described.

In the diagnostic method according to this embodiment, the RAM (M) to be diagnosed is divided into n pieces of partial regions (M={m1, m2, ..., mn}; m will be referred to as a base region) (where n is an integer of 3 or greater).

Then, a pair of base regions is selected from the divided base regions, and a diagnostic method described in Non-Patent Literature 1 (hereinafter denoted as Abraham) is performed on the selected regions.

Next, another pair of base regions is selected, and Abraham is performed on the selected pair. This is repeated until Abraham is performed on all combinations of pairs.

With this arrangement, a process equivalent to performing Abraham on the entire RAM region can be performed on each cell of the RAM.

By dividing the RAM into small diagnostic ranges, processing time can be reduced.

That is, a diagnosis can be executed during an idle time in the periodic processing of the embedded system.

The size of each base region can be changed depending on the system to be diagnosed.

With small base regions, the time required to process each pair of base regions is short, so that the method can be applied to a system with short periods of idle time. However, the number of pairs of base regions is large, so that the time required to complete the diagnosis of the entire RAM is long.

On the other hand, with large base regions, the time required to process each pair of base regions is long, so that the method can be applied only to a system with long periods of idle time. However, the number of pairs of base regions is small, so that the time required to complete the diagnosis of the entire RAM is short.

As described above, one of the characteristics of the diagnostic method according to this embodiment is that the base regions can be set depending on the time to complete a diagnosis and the periodic time interval that are required in the system.

In this embodiment, an example is described where Abraham is executed on the base regions. However, other types of diagnostic method may be applied, provided that a coupling fault can be detected.

An overview of the diagnostic method according to this embodiment is shown in FIG. 1 using an example.

In FIG. 1, an example is shown where a RAM 200 is divided into three base regions for diagnosis (M={m1, m2, m3}).

First, in period 1, the base regions m1 and m2 are selected to be diagnosed, and Abraham is executed on these two base regions by treating them as a single RAM.

The base regions selected to be diagnosed will be referred to as a target region 1 and a target region 2.

Figure 2:
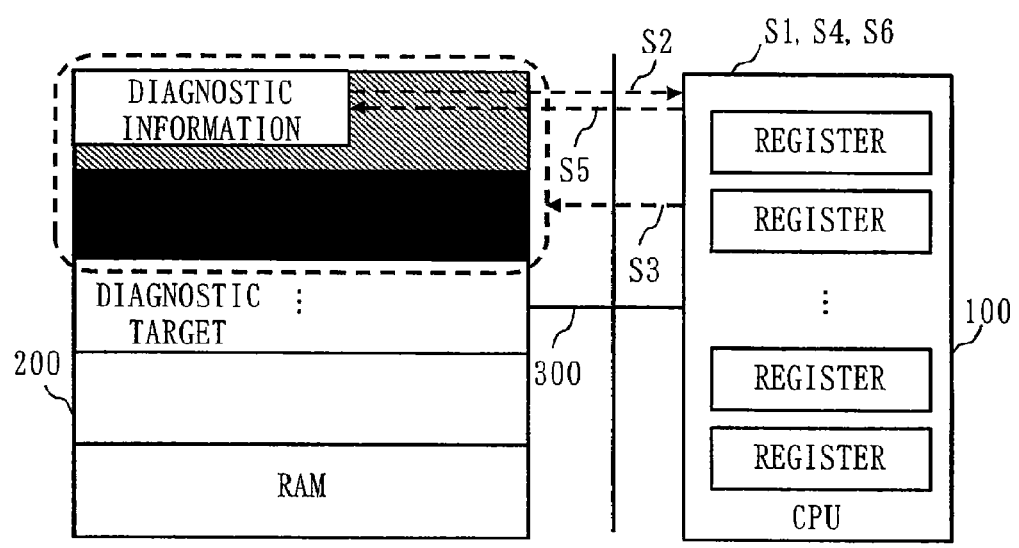
FIG. 2 is a diagram illustrating an example of a configuration for implementing the memory diagnostic method according to the first embodiment.

In FIGS. 1 and 2, regions enclosed by dashed lines indicate the regions to be diagnosed, with the target region 1 being represented by hatching and the target region 2 being represented by solid fill.

Then, in period 2, the base regions m1 and m3 are selected to be diagnosed, and Abraham is executed on these two regions by treating them as a single RAM.

Then, in period 3, the base regions m2 and m3 are selected to be diagnosed, and Abraham is executed on these two regions by treating them as a single RAM.

This completes the execution of Abraham on all combinations of pairs.

Figure 3:
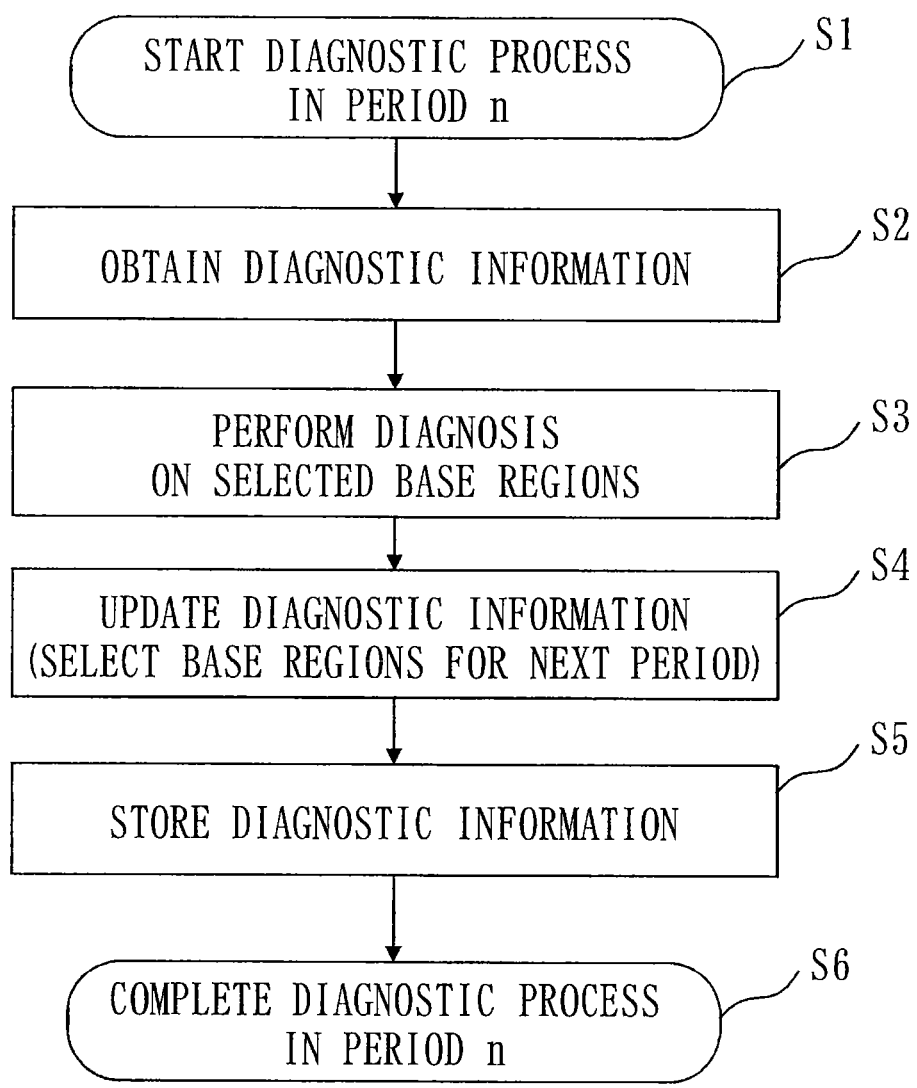
FIG. 3 is a flowchart illustrating a processing procedure of a memory diagnostic apparatus according to the first embodiment.

FIG. 2 shows an example of a configuration and FIG. 3 shows a processing procedure respectively for implementing the memory diagnostic method according to this embodiment.

There is a correspondence of step numbers (S1 to S6) between FIGS. 2 and 3.

In FIG. 2, 100 denotes a CPU (Central Processing Unit) that operates as a memory diagnostic apparatus.

The memory diagnostic method according to this embodiment is implemented as software operating on the CPU 100.

The CPU 100 reads from and writes to the RAM 200 via a bus 300, and performs a diagnosis.

A function substantially the same as this method may be implemented in hardware such as an FPGA (Field-Programmable Gate Array).

Data called diagnostic information is stored in a given region on the RAM 200.

Specifically, the diagnostic information refers to a start address of the target region 1, a start address of the target region 2, a size of each target region, and a size of the RAM.

Figure 5:
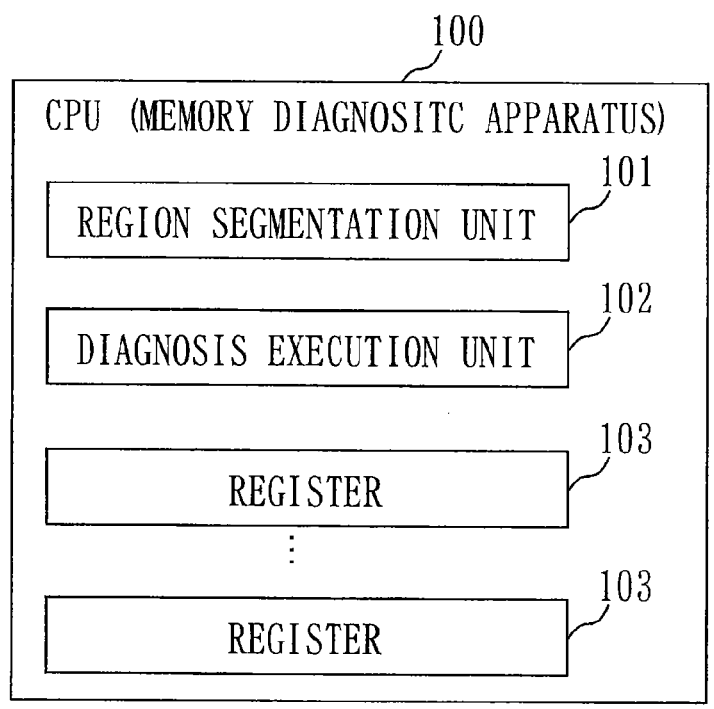
FIG. 5 is a diagram illustrating an example of a module configuration of the memory diagnostic apparatus according to the first embodiment.

FIG. 5 shows an example of a module configuration of the CPU 100 (memory diagnostic apparatus) of FIG. 2.

In FIG. 5, a region segmentation unit 101 and a diagnosis execution unit 102 are implemented as programs.

Registers 103 are used to store data of the target regions.

The region segmentation unit 101 divides the RAM region to be diagnosed into n (n being an integer of 3 or greater) pieces of base regions (partial regions).

In an idle time of periodic processing performed in an embedded system in which the RAM 200 is incorporated, the diagnosis execution unit 102 selects two base regions as the target regions from the n pieces of base regions, and diagnoses the selected two target regions using the diagnostic method that detects a coupling fault. By repeating this operation, the diagnosis execution unit 102 diagnoses all combinations of pairs of the base regions.

The diagnosis execution unit 102 may be configured to diagnose a plurality of pairs in one idle time.

An operational sequence of the CPU 100 according to this embodiment will now be described.

Figure 4:
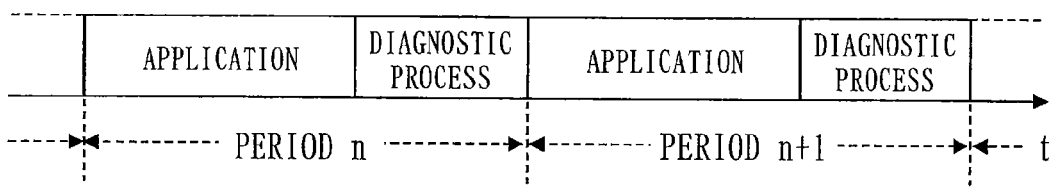
FIG. 4 is a diagram illustrating an example of timing of a diagnostic process according to the first embodiment.

This sequence is executed in a processing period of the embedded system, and is carried out during an idle time when no application is being executed (see FIG. 4).

First, a diagnostic process is started in a given period n (S1).

Then, the diagnosis execution unit 102 obtains the diagnostic information from the RAM 200, and stores the diagnostic information in the register 103 of the CPU 100 (S2).

Then, using the start address of the target region 1, the start address of the target region 2, and the size of each target region written in the diagnostic information, the diagnosis execution unit 102 determines a diagnostic range (selects a base region to be the target region 1 and a base region to be the target region 2), and executes Abraham on the diagnostic range (S3).

Then, using the start address of the target region 1, the start address of the target region 2, the size of each target region, and the size of the entire RAM in the diagnostic information, the diagnosis execution unit 102 selects target regions to be diagnosed in the next period n−1 (S4).

This selection algorithm may be a simple scheme that sequentially selects a pair or other types of scheme.

Then, the diagnosis execution unit 102 stores in the RAM 200 all the diagnostic information determined in S4 (S5).

The above completes the diagnostic process in the period n (S6).

To make data in the RAM 200 after a diagnosis identical with data in the RAM 200 before the diagnosis, a function may be added by which the contents of data of each target region are stored before the diagnosis as a backup in a RAM for a backup purpose or in a region of the RAM 200 different from the target regions, and the data stored as the backup is restored after the diagnosis.

The size of the target region 1 may be different from the size of the target region 2.

That is, the region segmentation unit 101 may divide the RAM 200 into the n pieces of base regions of varying region sizes.

In this case, the diagnosis execution unit 102 may select base regions of different region sizes as the target regions.

When the size of each base region is not uniform, it is necessary at the time of generation of the diagnostic information to identify the size of the target region 1 and the size of the target region 2 to be diagnosed in the next period and write the size of the target region 1 and the size of the target region 2 in the diagnostic information.

In this embodiment, the example has been described where the system in which the RAM 200 is incorporated is an embedded system. However, the memory diagnostic apparatus and the memory diagnostic method discussed in this embodiment can be applied to any type of system in which the RAM 200 is incorporated.

According to this embodiment, a diagnosis is carried out in an idle time of the periodic processing performed in the system in which the RAM to be diagnosed is incorporated, so that ramifications on application availability in the system can be eliminated.

A diagnosis using the diagnostic method capable of detecting a coupling fault is performed on all combinations of pairs of partial regions, so that a coupling fault can be detected effectively.

LIST OF REFERENCE SIGNS

100: CPU, 101: region segmentation unit, 102: diagnosis execution unit, 103: register, 200: RAM, 300: bus

The invention claimed is:

1. A memory diagnostic apparatus comprising:
   a region segmentation unit that divides a region of a memory to be diagnosed into n (n being an integer of 3 or greater) pieces of partial regions; and
   a diagnosis execution unit that repeats operations to select two partial regions from the n pieces of partial regions and diagnose the two partial regions selected using a diagnostic method capable of detecting a coupling fault, in an idle time of periodic processing performed in a system in which the memory is incorporated, so as to diagnose all combinations of pairs of partial regions.

2. The memory diagnostic apparatus according to claim 1, wherein the region segmentation unit divides the region of the memory into the n pieces of partial regions such that each partial region has a different region size, and
   wherein the diagnosis execution unit selects two partial regions of different region sizes.

3. The memory diagnostic apparatus according to claim 1, wherein the diagnosis execution unit diagnoses a plurality of pairs of partial regions in one idle time.

4. A memory diagnostic method comprising:
   dividing a region of a memory to be diagnosed into n (n being an integer of 3 or greater) pieces of partial regions; and
   repeating operations to select two partial regions from the n pieces of partial regions and diagnose the two partial regions selected using a diagnostic method capable of detecting a coupling fault, in an idle time of periodic processing performed in a system in which the memory is incorporated, so as to diagnose all combinations of pairs of partial regions.

5. A non-transitory computer readable medium including computer executable instructions that make a processor device execute:
   a region segmentation process of dividing a region of a memory to be diagnosed into n (n being an integer of 3 or greater) pieces of partial regions; and
   a diagnosis execution process of repeating operations to select two partial regions from the n pieces of partial regions and diagnose the two partial regions selected using a diagnostic method capable of detecting a coupling fault, in an idle time of periodic processing performed in a system in which the memory is incorporated, so as to diagnose all combinations of pairs of partial regions.

* * * * *